Dec. 1, 1964 J. VAN SANDWYK 3,159,796

DIRECT CURRENT CONTROLLED BRIDGE TYPE ATTENUATOR

Filed July 10, 1961

INVENTOR.
JOHANNES VAN SANDWYK
BY
T. L. Steyner
ATTORNEY 3,159,796

DIRECT CURRENT CONTROLLED BRIDGE TYPE ATTENUATOR

Johannes Van Sandwyk, Rochester, N.Y., assignor to General Dynamics Corporation, Rochester, N.Y., a corporation of Delaware Filed July 10, 1961, Ser. No. 122,879
4 Claims. (Cl. 330—138)

This invention relates to attenuators and is particularly directed to bridge networks for controlling the attenuation in signal frequency circuits. The attenuator of this invention is of the type particularly adapted for automatic gain control circuits in the audio, I.F., and/or R.F. amplifiers of a radio receiver, or transmitter, where attenuation must be a function of a direct current gain control signal.

Many automatic gain control circuits employing current sensitive resistance devices, such as diodes, introduce distortion because the resistance of the device changes instantaneously and will change in resistance throughout the cycle of operating frequency.

The principal object of this invention is to provide an improved attenuating network suitable for signal frequencies and responsive to direct current control.

A more specific object of this invention is to provide an improved attenuating network with a wide range of attenuation and which is particularly adapted for low impedance transistor circuits.

A still more specific object of this invention is to provide an improved attenuating network suitable for high frequency which is responsive to direct current control and which is balanced with respect to reference ground and which is adapted for automatic gain control without distortion.

The objects of this invention are attained with a balanced four-sided bridge with the two diagonals of the bridge coupled, respectively, to a source of signal frequency and to a load for the signal frequency, so that when the bridge is balanced the attenuation between the source and load is infinite. Current-sensitive resistances are placed in at least one branch of the four-sided bridge and a direct current circuit is connected across the resistance to control the degree of imbalance as a function of the direct current. By a novel arrangement of blocking and bypass condensers, the signal frequency source is effectively isolated from the source of direct current. According to an important embodiment of the invention, the current sensitive resistance is a resistor which has a finite time constant substantially greater than zero, to prevent attenuator distortion of the individual cycles of the signal wave.

Figure 1:
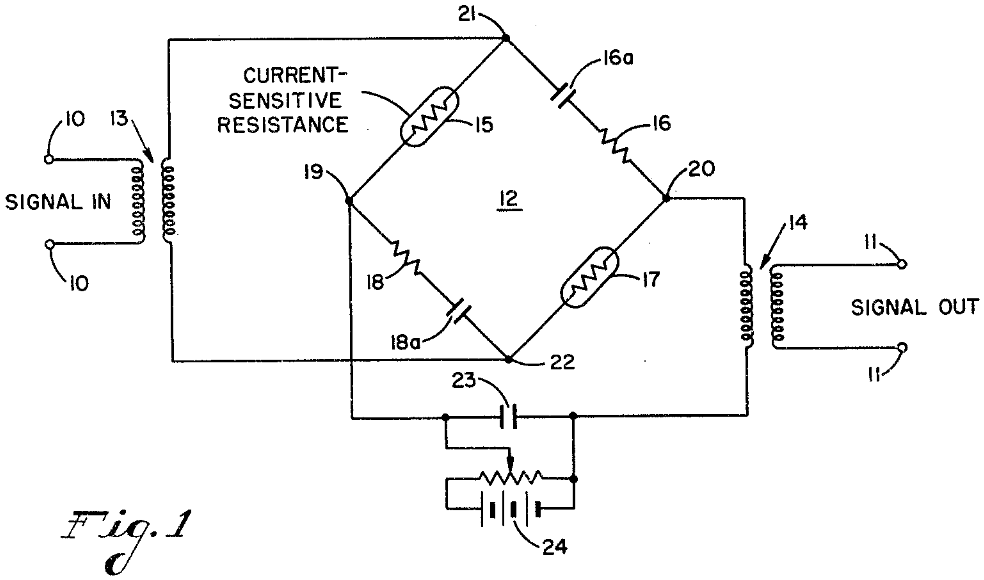
Figure 2:
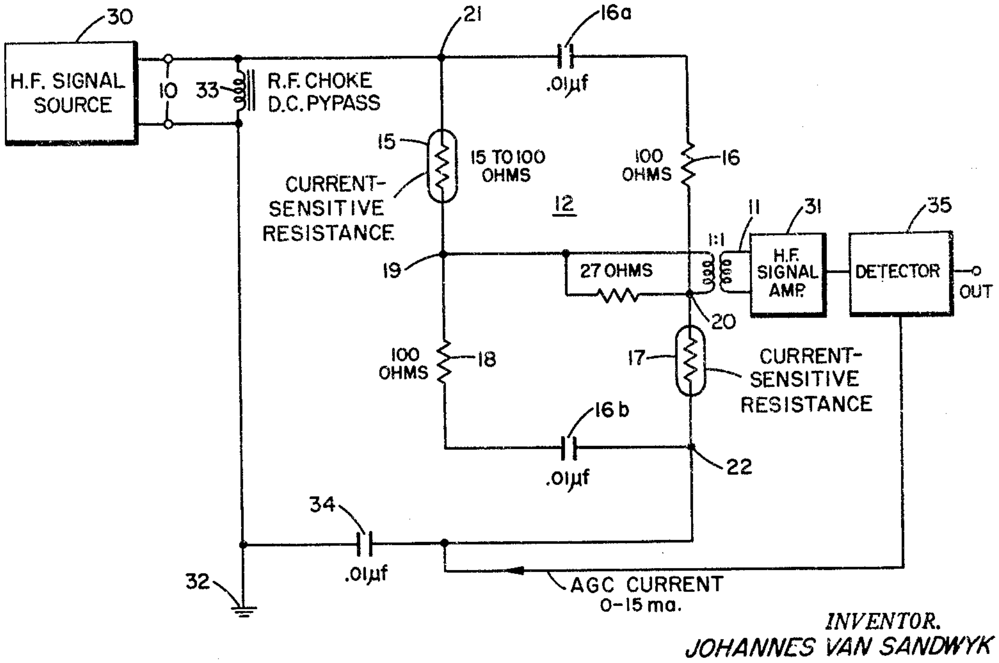

Other objects and features of this invention will become apparent to those skilled in the art by referring to specific embodiments of the invention described in the following specification and shown in the accompanying drawing, in which:

FIG. 1 is a schematic circuit diagram of a preferred embodiment of an attenuator of this invention; and FIG. 2 is a schematic circuit diagram of an attenuator of this invention employed in an automatic gain control for a high-frequency amplifier circuit.

In FIG. 1, signal frequency energy applied at input terminals 10 are, after controllable attenuation, delivered to the output terminals 11. It is not necessary that either side of the input circuit 10 nor output circuit 11 be referred to ground. Preferably, the attenuating balanced four-sided bridge 12 is coupled, respectively, in the input and output circuits by conventional coupling transformers 13 and 14. The four branches 15, 16, 17 and 18 of the bridge 12 are resistive in nature. Preferably, branches 16 and 18 are complementary and are fixed resistances coupled, respectively, in series with D.C. blocking condensers 16*a* and 18*a*, the functions of which will be described hereinafter. Either one or both of the resistances 17 and 15 in the two remaining, complementary branches are current-sensitive.

The primary winding of output transformer 14 is coupled to the output diagonal 19–20 through the blocking condenser 23. According to an important feature of this invention, the direct current source 24, which is adjustable, is connected across blocking condenser 23. Hence, heating current will flow from the source 24 through current-sensitive resistance 15, through the secondary winding of transformer 13, resistance 17, and finally through the primary winding of transformer 14, to the opposite terminal of the D.C. source. It will appear now that the blocking condensers 16*a* and 18*a* are necessary to prevent short circuiting of this circuit by the fixed resistors 16 or 18.

One current-sensitive resistance which has been found to be practical comprises the tungsten filament of a miniature flashlight bulb with a positive temperature coefficient of resistance. The commercially obtainable "Kay Penlite" bulb has been employed with success. The filament of such a bulb is minute and has a time constant of 5 milliseconds between cold and steady hot temperature, a room temperature resistance of 15 ohms and a resistance of 100 ohms at full, rated operating current. The values of fixed resistances 16 and 18 may be chosen so that the bridge is balanced when the variable resistances of resistors 15 and 17 are either of maximum or of minimum value. That is, the bridge may be designed to be balanced for either zero direct current or for any desired finite value of direct current through the resistances. As is well known, the high frequency voltage between apices 19–20 of the output diagonal of the bridge is zero when the bridge is balanced, regardless of the amplitude of the high frequency voltage applied across apices 21–22 of the input diagonal of the bridge. One advantage of an evacuated light bulb is the heat insulation provided for the filament, thus minimizing the effects of ambient temperature.

In operation, the amount of heating current passed through the current-sensitive resistances 15 and 17 is regulated to determine the resistive values of 15 and 17 to control the degree of imbalance of the bridge and to in turn determine the attenuation of the high frequency flowing between input 10 and output 11. As suggested above, the quiescent level of attenuation can be predetermined so that either an increase or decrease in heating current will increase the imbalance and decrease the attenuation. It will be noted that the signal frequency flowing in the attenuator circuit is effectively isolated from the heating current source and that neither side of the high frequency circuits need necessarily be referred to ground.

FIG. 2 is shown a schematic diagram of the attenuator of this invention applied to the high frequency signal circuit of an intermediate frequency amplifier conventionally employed in a radio receiver or transmitter. The bridge circuit 12 is coupled between amplifier stages 30 and 31 of the amplifier. Resistive elements 15, 16, 17 and 18 in FIG. 2 correspond to similarly referenced elements in FIG. 1. Diagonal 21–22 is connected across output terminals 10 of high frequency source 30 to one amplifier stage, while diagonal 19–20 is coupled across the input to the next stage. In the specific example shown in FIG. 2 one side of the input is connected to ground 32 and a high frequency choke coil 33 is connected across the terminals 10 to bypass direct current between the two terminals. Further in the specific circuits of FIG. 2, the bypass condenser 34 and the direct current current source are connected in the input circuit to the bridge as distinguished from FIG. 1 where the condenser 23 is connected in the output circuit of the bridge. An automatic gain control voltage derived in a conventional manner from the detector circuit 35 is applied to one side of bypass condenser 34. Since a ground circuit is employed here, the AGC circuit may be completed through ground.

In operation, with the specific values of components indicated in FIG. 2, the minimum attenuation in the bridge of the intermediate frequency signal was 7.2 decibels with zero direct current voltage applied by the AGC circuit. The maximum attenuation of this specific circuit is 40 decibels when the direct current is 15 milliamperes. These values and attenuation range were found to be acceptable for an I.F. amplifier where the input signal amplitude varied over a wide range. Greater attenuation can be obtained if the bridge arms are balanced when the direct current is 15 milliamperes.

It is important to note that this attenuator works equally well at radio, intermediate and audio frequencies. The minimum operating frequency, at which distortion occurs, is solely determined by the time constant of the current variable resistor sources 15 and 17. In this particular example, the "Kay Penlite" lamps have a 5 millisecond time constant. This sets the minimum frequency at approximately 200 cycles per second above which no distortion can result. This is important because there are few audio AGC circuits that do not introduce distortion. When the time constant of the lamps is large compared to the reciprocal of the operating frequency, the system is distortionless because the resistance of the lamps does not vary throughout the cycle of the operating frequency, in contrast to systems that use diodes or transistors, which operate on instantaneous voltage or current.

Many modifications may be made in this attenuator without departing from the scope of the following claims. For example, the attenuation characteristic as a function of direct current can be made to have any desired slope or sign by appropriately changing the resistance values of the bridge. The values of the bypass condensers 16*a*, 16*b* and 34 are chosen for minimum attenuation of the particular frequency to be amplified.

What is claimed is:

1. A high frequency signal attenuator comprising a four-sided balanced bridge with four resistive branches, a high frequency source coupled across one diagonal of said bridge, a high frequency load coupled across the other diagonal of said bridge, the resistances of two complementary branches of said bridge being current-sensitive, the time constant of said current-sensitive resistance being greater than the period of said high frequency, a direct current blocking condenser in each of the remaining two branches, a direct current blocking condenser in series with the high frequency circuit across one of said diagonals, and a source of automatic gain control current connected across the last-mentioned blocking condenser for finely regulating the signal current through the current-sensitive resistances and for controlling the degree of unbalance of the bridge, without distortion of a signal.

2. A high frequency signal attenuator for automatic gain control between two cascaded amplifier states, means responsive to the signal in said stages for generating a control current, said attenuator comprising a four-sided bridge with the two diagonals of the bridge coupled, respectively, to the output of one of said stages and to the input of the succeeding stage, one branch of said bridge comprising a current-sensitive resistor, said current-sensitive resistor having a time constant greater than the period of the signal to be controlled, means for controlling the resistance of said current-sensitive resistor and the degree of unbalance of said bridge comprising said control current means and a direct current circuit, said direct current circuit being connected across one diagonal of said bridge, direct current blocking condensers in the branches of said bridge adjacent said one branch and a bypass condenser connected across said source to prevent direct current short circuit of said source.

3. A high frequency signal attenuator comprising a four-sided bridge network with a first, a second, a third and a fourth resistive branch, a high frequency source coupled across one diagonal of said bridge, a high frequency load coupled across the other diagonal of said bridge, an adjustable direct current source connected across one diagonal of said bridge, said direct current source being bypassed by a condenser with low impedance for the operating high frequency, two complementary branches of said bridge containing current-sensitive resistances to be heated by said direct current source, the two remaining branches of said bridge containing direct current blocking condensers for passing only said operating high frequency.

4. An automatic volume control circuit for two cascaded high frequency amplifiers, said circuit comprising a four-sided balanced resistive bridge, one diagonal of said bridge being coupled to the output of one of said stages and the other diagonal of said bridge being coupled to the succeeding stage, two of said branches of said bridge containing blocking condensers, at least one of the remaining branches of said bridge containing a current-sensitive resistance, and a direct current source responsive to the signal level in one of said amplifiers being coupled across one of said diagonals, said current source being bypassed by a condenser of low impedance for the operating frequency.

References Cited in the file of this patent

UNITED STATES PATENTS

| | | |
|---|---|---|
| 1,875,156 | Roberts | Aug. 30, 1932 |
| 1,940,874 | Metz | Dec. 26, 1933 |
| 2,021,920 | Norwine | Nov. 26, 1935 |
| 2,035,263 | Cushman | Mar. 24, 1936 |
| 2,087,949 | Holden | July 27, 1937 |
| 2,087,950 | Holden | July 27, 1937 |
| 2,098,370 | Bartels | Nov. 9, 1937 |
| 2,207,748 | Meacham | July 16, 1940 |
| 2,212,832 | Holzer | Aug. 27, 1940 |
| 2,275,452 | Meacham | Mar. 10, 1942 |
| 2,971,164 | Saari | Feb. 7, 1961 |

FOREIGN PATENTS

| | | |
|---|---|---|
| 366,920 | Great Britain | Feb. 8, 1932 |